(12) United States Patent
Tobita et al.

(10) Patent No.: US 7,499,518 B2
(45) Date of Patent: Mar. 3, 2009

(54) SHIFT REGISTER AND IMAGE DISPLAY APPARATUS CONTAINING THE SAME

(75) Inventors: Youichi Tobita, Tokyo (JP); Hiroyuki Murai, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 106 days.

(21) Appl. No.: 11/532,750

(22) Filed: Sep. 18, 2006

(65) Prior Publication Data

US 2007/0147573 A1    Jun. 28, 2007

(30) Foreign Application Priority Data

Dec. 28, 2005    (JP)    ............................. 2005-377540

(51) Int. Cl.
*G11C 19/00*    (2006.01)
(52) U.S. Cl. ............................. 377/64; 377/68; 377/74
(58) Field of Classification Search .................... 377/64, 377/70, 73, 74, 68
See application file for complete search history.

(56) References Cited

U.S. PATENT DOCUMENTS 6,300,928 B1 * 10/2001 Kim .............................. 345/92
6,556,646 B1 * 4/2003 Yeo et al. ....................... 377/54
6,690,347 B2 * 2/2004 Jeon et al. ..................... 345/100
6,813,332 B2    11/2004 Nagao et al.

FOREIGN PATENT DOCUMENTS

JP    2004-103226    4/2004
JP    2004-246358    9/2004

* cited by examiner

Primary Examiner—Tuan T Lam
(74) Attorney, Agent, or Firm—Oblon, Spivak, McClelland, Maier & Neustadt, P.C.

(57) ABSTRACT

A shift register includes, in the output stage, a first transistor connected between an output terminal and a first clock terminal and a second transistor connected between the output terminal and a first power terminal. Third and fourth transistors constitute an inverter which inverses the level of the gate of the second transistor and outputs it to the gate of the first transistor. An isolation circuit formed by fifth and sixth transistors is provided between the gate of the first transistor and the gate of the fourth transistor. The fifth transistor is diode-connected. When the gate of the first transistor becomes higher than the gate of the fourth transistor, the first and fourth transistors are electrically isolated from each other.

8 Claims, 13 Drawing Sheets

F I G . 3
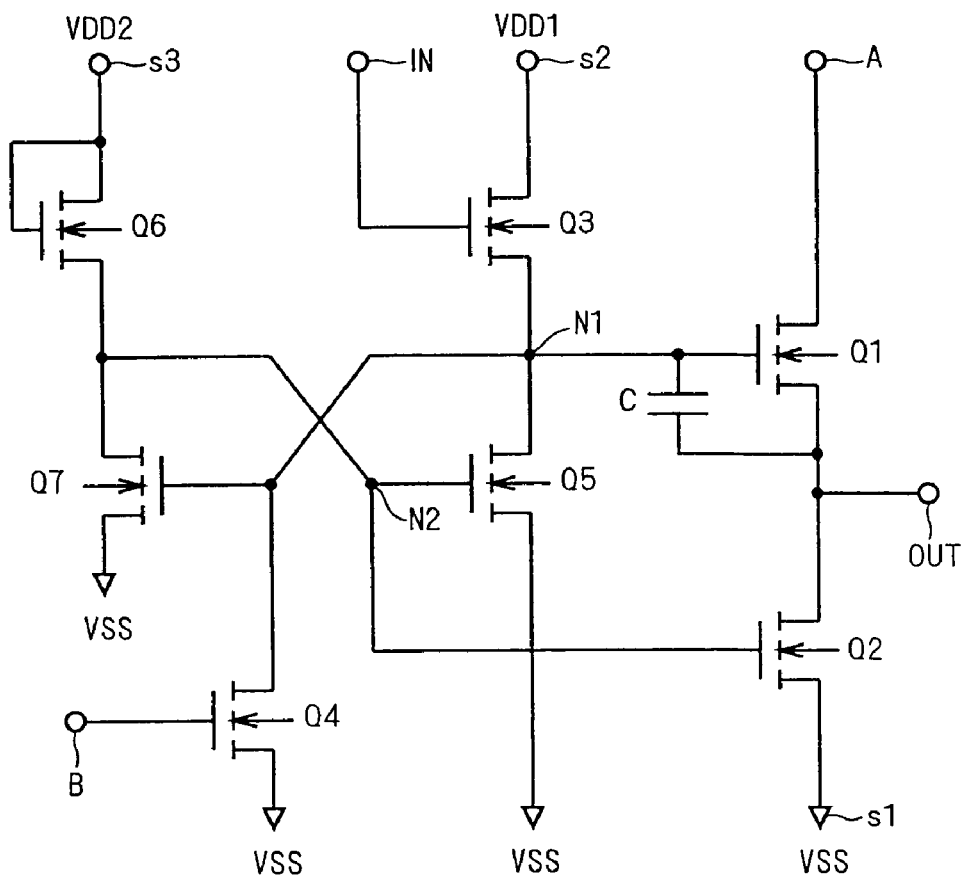
PRIOR ART

F I G . 7
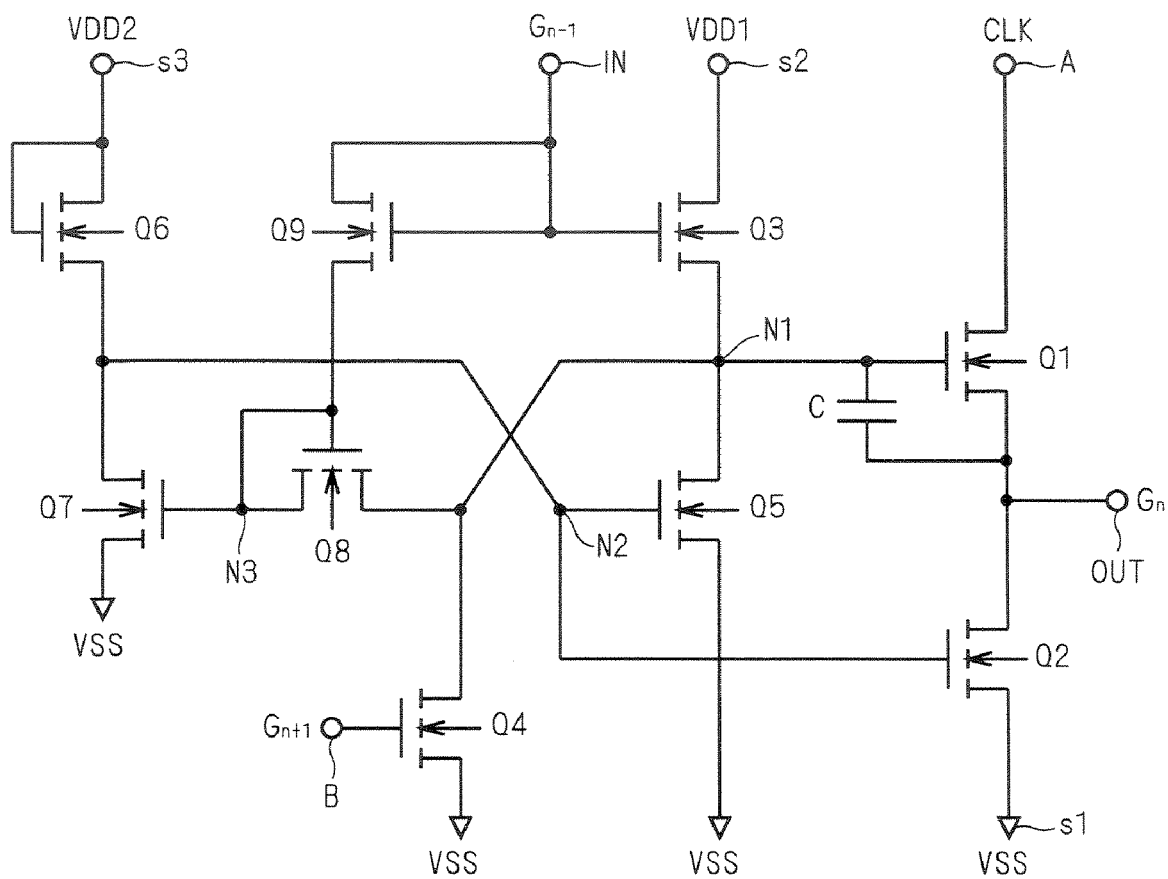

F I G . 8
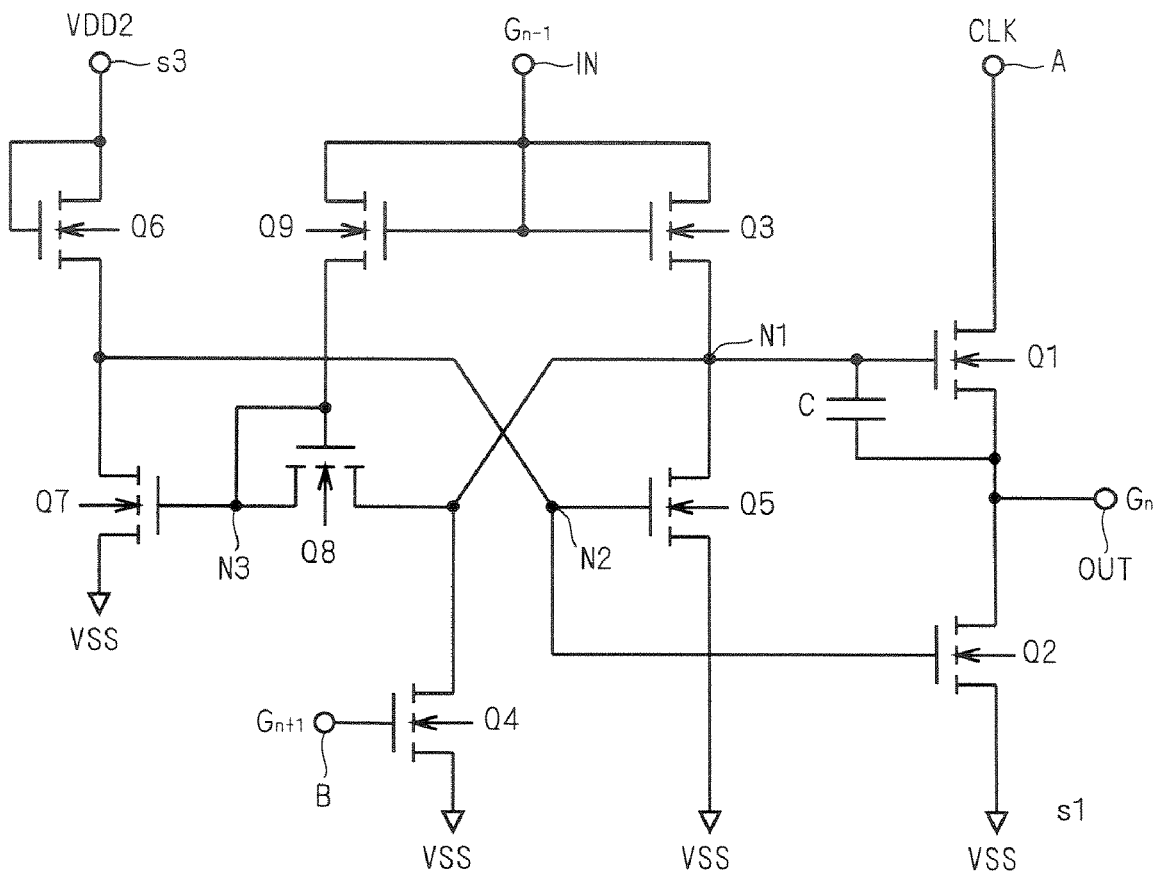

F I G . 1 1
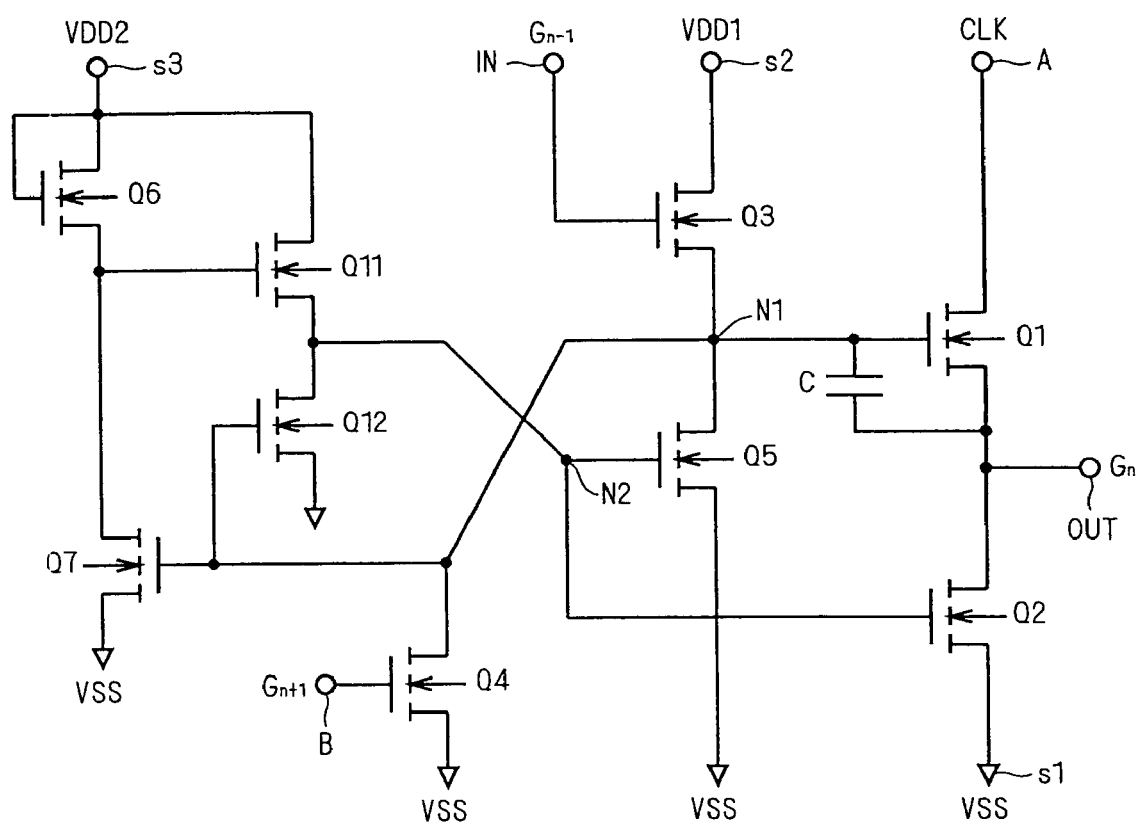
PRIOR ART

F I G . 1 2
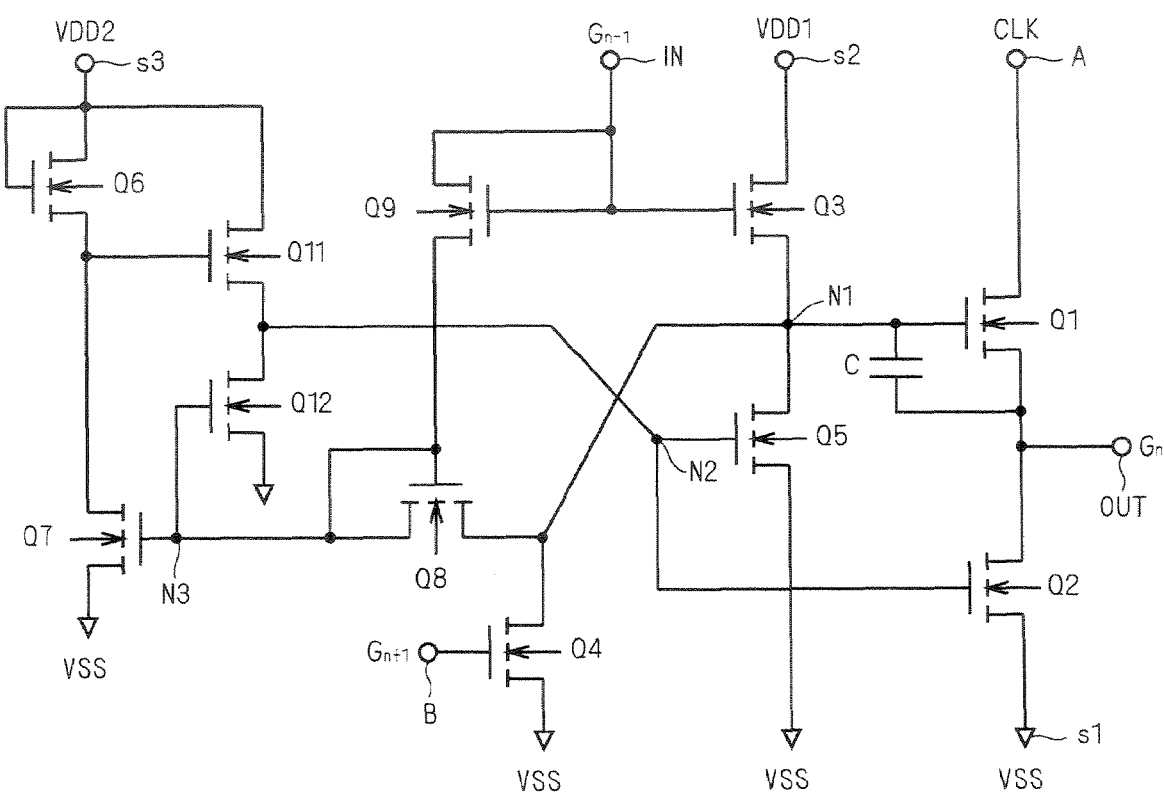

SHIFT REGISTER AND IMAGE DISPLAY APPARATUS CONTAINING THE SAME

BACKGROUND OF THE INVENTION

1. Field of the Invention

The present invention relates to a shift register, and more particularly, to a shift register for use as a scanning-line driving circuit for an image display apparatus or the like, which is formed by field effect transistors of the same conductivity type only.

2. Description of the Background Art

An image display apparatus (hereinafter referred to as a "display apparatus") such as a liquid crystal display includes a display panel in which a plurality of pixels are arrayed in a matrix. A gate line (scanning line) is provided for each row of pixels (pixel line), and gate lines are sequentially selected and driven in a cycle of one horizontal period of a display signal, so that a displayed image is updated. As a gate-line driving circuit (scanning-line driving circuit) for sequentially selecting and driving pixel lines, i.e., gate lines, a shift register for performing a shift operation in one frame period of a display signal can be used.

To reduce the number of steps in the manufacturing process of a display apparatus, such shift register used as the gate-line driving circuit is preferably formed by field effect transistors of the same conductivity type only. Accordingly, various types of shift registers formed by N- or P-type field effect transistors only and display apparatuses containing such shift registers have been proposed (e.g., Japanese Patent Application Laid-Open Nos. 2004-246358 and 2004-103226). As a field effect transistor, a metal oxide semiconductor (MOS) transistor, a thin film transistor (TFT), or the like is used.

A typical shift register shown in, e.g., FIG. 7 of JP2004-246358 includes, in the output stage, a first transistor (pull-up MOS transistor Q1) connected between an output terminal (first gate-voltage signal terminal GOUT in JP2004-246358) and a clock terminal (first power clock CKV) and a second transistor (pull-down MOS transistor Q2) connected between the output terminal and a reference voltage terminal (gate-off voltage terminal VOFF). A clock signal input to the clock terminal is transmitted to the output terminal with the first transistor turned on and the second transistor turned off, so that the shift register outputs an output signal.

Particularly, each of shift registers constituting a gate-line driving circuit needs to activate each gate line by charging at high speeds using the output signal, which requires the first transistor to have a high driving capability (current driving capability). Accordingly, a gate-source voltage of the first transistor is preferably maintained high even while the output terminal, i.e., the source of the first transistor is at the H (high) level. Therefore, the shift register disclosed in JP2004-246358 is provided with a step-up capacitor (capacitor C) between the gate and source of the first transistor, and is configured such that the gate of the first transistor is also stepped up when the output terminal rises to the H level.

As the degree of step-up increases, the gate-source voltage of the first transistor increases, which in turn increases the driving capability of the first transistor. Conversely, the first transistor needs to be stepped up higher in order that the shift register can charge the gate line at high speeds.

SUMMARY OF THE INVENTION

An object of the present invention is to achieve improved driving capability of a shift register.

According to the present invention, the shift register includes a first transistor configured to supply a clock signal input at a clock terminal to an output terminal, the first transistor having a control electrode connected to a first node, a second transistor configured to discharge the output terminal, the second transistor having a control electrode connected to a second node, and at least one third transistor having a control electrode connected to a third node which connects to the first node through a predetermined isolation circuit. The isolation circuit electrically isolates the third and first nodes from each other when the first node is higher than the third node in absolute value of potential.

When stepping up the first node, the first and third nodes are electrically isolated from each other. Thus, a parasitic capacitance (gate capacitance) of the third transistor does not contribute to a parasitic capacitance of the first transistor at the time of stepping up the first node, which reduces the parasitic capacitance at the first node. As the parasitic capacitance of the first node decreases, the step-up amount at the first node increases, resulting in higher driving capability of the first transistor at the time of stepping up. This allows the unit shift register to charge a gate line at high speeds.

These and other objects, features, aspects and advantages of the present invention will become more apparent from the following detailed description of the present invention when taken in conjunction with the accompanying drawings.

BRIEF DESCRIPTION OF THE DRAWINGS

FIG. 3 is a circuit diagram illustrating the configuration of a conventional unit shift register;

FIG. 7 is a circuit diagram illustrating the configuration of a unit shift register according to a first preferred embodiment of the present invention;

FIG. 8 is a circuit diagram illustrating the configuration of a unit shift register according to a second preferred embodiment of the present invention;

FIG. 11 is a circuit diagram illustrating the configuration of another conventional unit shift register; and FIGS. 12 and 13 are circuit diagrams each illustrating the configuration of a unit shift register according to a fifth preferred embodiment of the present invention.

DESCRIPTION OF THE PREFERRED EMBODIMENTS

Figure 1:
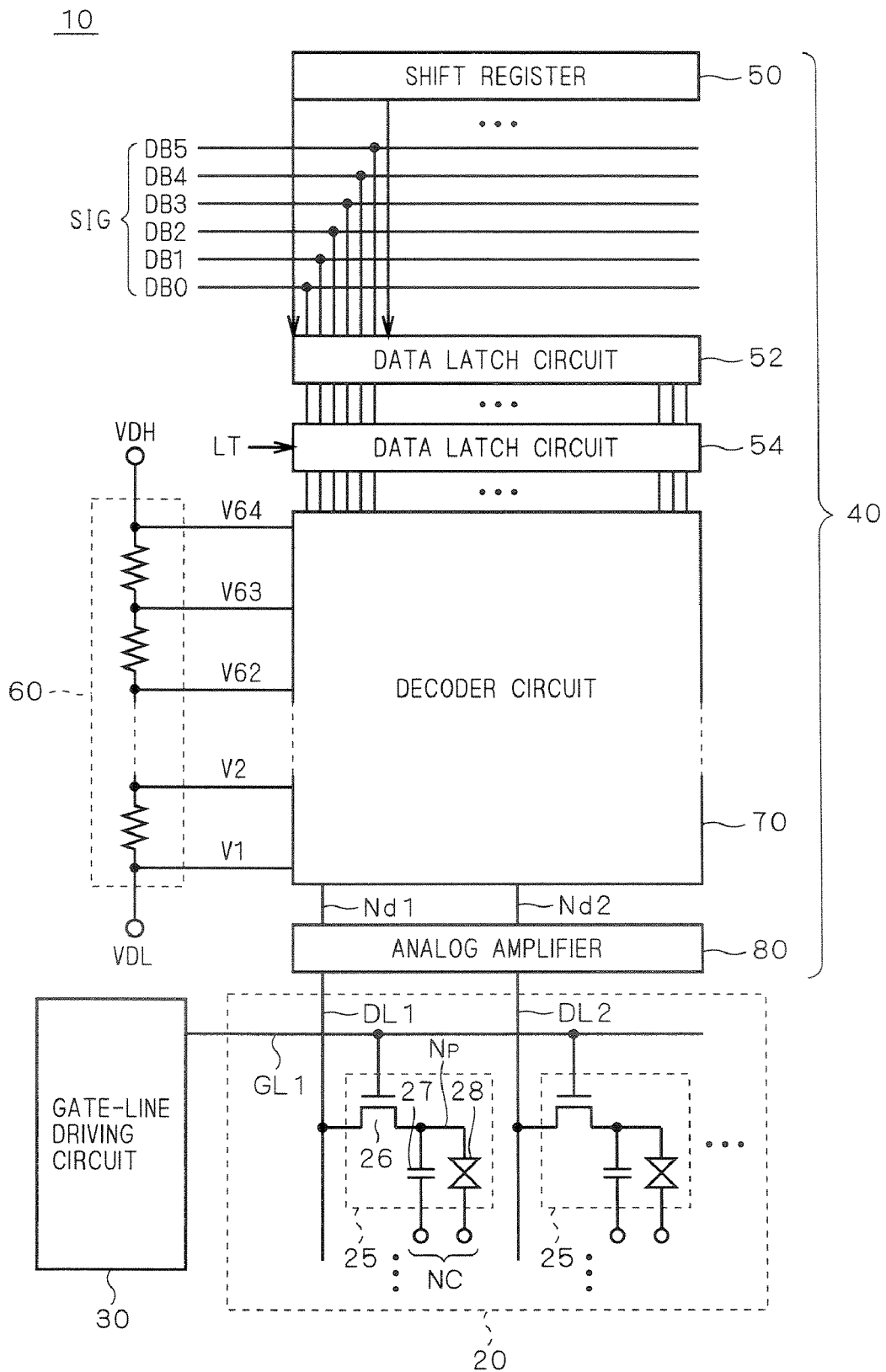
FIG. 1 is a schematic block diagram illustrating the configuration of a display apparatus according to the present invention.

Preferred embodiments of the present invention will be described hereinbelow referring to the accompanied drawings. To avoid repeated and redundant description, elements having the same or corresponding functions are indicated by the same reference characters in the drawings.

First Preferred Embodiment

FIG. 1 is a schematic block diagram illustrating the configuration of a display apparatus according to the present invention. The overall configuration of a liquid crystal display 10 is shown as an representative example of the display apparatus.

The liquid crystal display 10 is provided with a liquid crystal array part 20, a gate-line driving circuit (scanning-line driving circuit) 30 and a source driver 40. As will be described later explicitly, a shift register according to the present embodiment is mounted on the gate-line driving circuit 30.

The liquid crystal array part 20 includes a plurality of pixels 25 arrayed in a matrix. The columns of pixels (hereinafter also referred to as "pixel lines") are respectively provided with gate lines GL1, GL2, . . . (hereinafter also generically referred to as a "gate line GL"), and the rows of pixels (hereinafter also referred to as "pixel rows") are respectively provided with data lines DL1, DL2, . . . (hereinafter generically referred to as a "data line DL"). FIG. 1 representatively shows pixels 25 of the first and second rows in the first column and corresponding gate line GL1 and data lines DL1 and DL2.

Each pixel 25 has a pixel switching device 26 disposed between a corresponding data line DL and a pixel node Np, and a capacitor 27 and a liquid crystal display device 28 connected in parallel between the pixel node Np and a common electrode node NC. The crystal orientation in the liquid crystal display device 28 changes depending on the potential difference between the pixel node Np and common electrode node NC, and in response to this change, the display luminance of the liquid crystal display device 28 changes. Accordingly, the luminance of each pixel 25 can be controlled by a display voltage transmitted to the pixel node Np via the data line DL and pixel switching device 26. In other words, an intermediate potential difference between a potential difference corresponding to the maximum luminance and a potential difference corresponding to the minimum luminance is applied between the pixel node Np and common electrode node NC, whereby halftone luminance can be obtained. Therefore, setting display voltages stepwise, grayscale luminance can be obtained.

The gate-line driving circuit 30 sequentially selects and drives a gate line GL in a predetermined scanning cycle. Each pixel switching device 26 has its gate electrode connected to a corresponding gate line GL. While a certain gate line GL is selected, the pixel switching device 26 is brought into the conducting state in each pixel 25 connected to the selected gate line GL, whereby the pixel node Np is connected to a corresponding data line DL. Then, the display voltage transmitted to the pixel node Np is held by the capacitor 27. Generally, the pixel switching device 26 is constructed from a TFT formed on a substrate of the same insulator as the liquid crystal display device 28 (a glass substrate, a resin substrate or the like).

The source driver 40 is provided to output display voltages set stepwise by a display signal SIG which is an N-bit digital signal, to the data lines DL. As an example, the display signal SIG is assumed to be a 6-bit signal including display signal bits DB0 to DB5. With such 6-bit display signal SIG, $2^6=64$ levels of gray can be displayed in each pixel 25. Further, a display of approximately 260 thousand colors can be achieved by forming one color display unit by three pixels of R (Red), G (Green) and B (Blue).

As shown in FIG. 1, the source driver 40 includes a shift register 50, data latch circuits 52, 54, a gradation voltage generating circuit 60, a decoder circuit 70 and an analog amplifier 80.

In the display signal SIG, the display signal bits DB0 to DB5 corresponding to the display luminance of respective pixels 25 are serially generated. In other words, each of the display signal bits DB0 to DB5 with each timing indicates the display luminance of any one pixel 25 in the liquid crystal array part 20.

The shift register 50 gives an instruction to the data latch circuit 52 to capture the display signal bits DB0 to DB5 in synchronization with a cycle during which the settings of the display signal SIG are changed. The data latch circuit 52 sequentially captures serially-generated display signals SIG to latch display signals SIG for one pixel line.

A latch signal LT input to the data latch circuit 54 is activated with timing when display signals SIG for one pixel line are captured by the data latch circuit 52. In response to this, the data latch circuit 54 captures the display signals SIG for one pixel line latched by the data latch circuit 52 at that time.

The gradation voltage generating circuit 60 is formed by 63 resistor dividers connected in series between a high voltage VDH and a low voltage VDL, for generating 64 levels of gradation voltages V1 to V64, respectively.

The decoder circuit 70 decodes display signals SIG latched by the data latch circuit 54, and based on the result of decoding, selects voltages to be respectively output to decoder output nodes Nd1, Nd2, . . . (generically referred to as a "decoder output node Nd") from among the gradation voltages V1 to V64, and outputs the selected voltages.

As a result, display voltages (selected from among the gradation voltages V1 to V64) corresponding to the display signals SIG for one pixel line latched by the data latch circuit 54 are output to the decoder output node Nd at the same time (in parallel). FIG. 1 representatively shows the decoder output nodes Nd1 and Nd2 corresponding to the data line DL1 of the first row and the data line DL2 of the second row, respectively.

The analog amplifier 80 outputs analog voltages corresponding to display voltages output from the decoder circuit 70 to the decoder output nodes Nd1, Nd2, . . . , to the data lines DL1, DL2, . . . , respectively.

The source driver 40 repeatedly outputs display voltages corresponding to a series of display signals SIG for one pixel line to the data line DL in a predetermined scanning cycle, and the gate-line driving circuit 30 sequentially drives the gate lines GL1, GL2, . . . in synchronization with the scanning cycle. Accordingly, image display based on the display signals SIG is provided on the liquid crystal array part 20.

FIG. 1 shows an example of the liquid crystal display 10 with the gate-line driving circuit 30 and source driver 40 formed integrally with the liquid crystal array part 20, however, the gate-line driving circuit 30 and source driver 40 may be provided as an external circuit of the liquid crystal array part 20.

Figure 2:
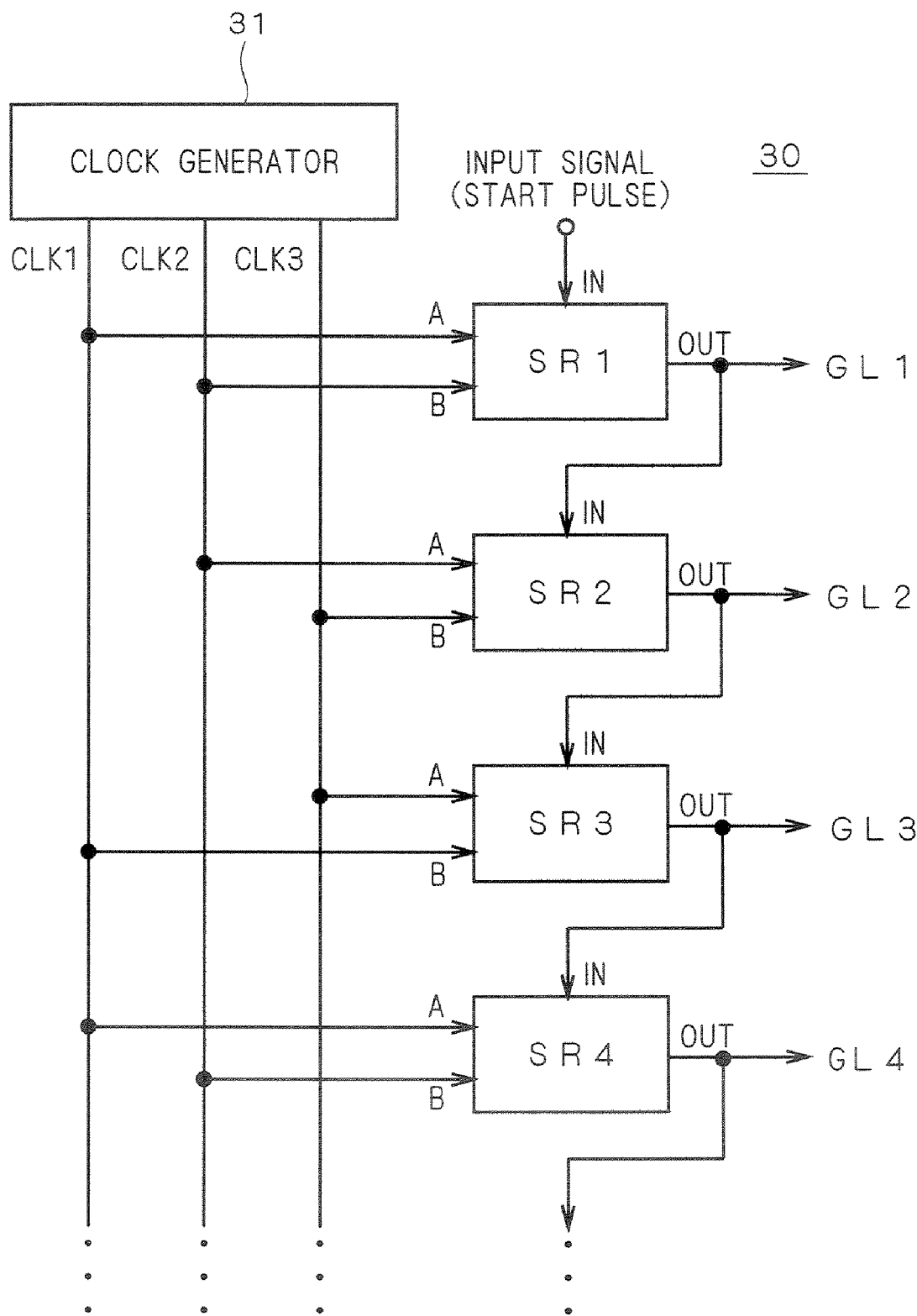
FIG. 2 is a block diagram illustrating an exemplary configuration of a gate-line driving circuit using unit shift registers according to the present invention.

FIG. 2 shows the configuration of the gate-line driving circuit 30. The gate-line driving circuit 30 includes a plurality of shift registers SR1, SR2, SR3, SR4, . . . connected in cascade (for ease of description, each of the cascaded shift registers SR1, SR2, . . . will generically be called a "unit shift register SR"). Each unit shift resister SR is provided for one pixel line, i.e., one gate line GL.

A clock generator 31 shown in FIG. 2 is provided to input three phase clock signals CLK1, CLK2 and CLK3, shifted in phase with each other, to the unit shift register SR of the gate-line driving circuit 30. The clock signals CLK1, CLK2 and CLK3 are controlled to be sequentially activated in synchronization with the scanning cycle of the display apparatus.

Each unit shift register SR includes an input terminal IN, an output terminal OUT, and first and second clock terminals A and B. As shown in FIG. 2, two of the clock signals CLK1, CLK2 and CLK3 output from the clock generator 31 are supplied to the clock terminals A and B of each unit shift register SR, respectively. Each unit shift register SR has its output terminal OUT connected to a gate line GL. A start pulse corresponding to the head of each frame period of an image signal is input as an input signal to the input terminal IN of the unit shift register SR1 of the first stage. Input as an input signal to the input terminal IN of each of the unit shift registers SR of the second and following stages is an output signal output from the output terminal OUT of the immediately preceding stage. The output signal of each unit shift register SR is output to the gate line GL as a horizontal (or vertical) scanning pulse.

With the gate-line driving circuit 30 of such configuration, each unit shift register SR outputs an input signal received from the immediately preceding stage (output signal from the immediately preceding stage) to a corresponding gate line GL and to a unit shift register SR of the immediately succeeding stage while shifting the input signal in synchronization with the clock signals CLK1, CLK2 and CLK3 (operation of the unit shift register SR will be described later in detail). As a result, a series of unit shift registers SR serve as a so-called gate-line driving unit for sequentially activating gate lines GL with timing based on the predetermined scanning cycle.

For ease of description of the present invention, a conventional unit shift register will now be described. FIG. 3 is a circuit diagram illustrating the configuration of the conventional unit shift register SR. In the gate-line driving circuit 30, the respective unit shift registers SR connected in cascade have substantially the same configuration. Therefore, the configuration of one unit shift register SR will be described below as a representative example. Transistors constituting the unit shift register SR are all field-effect transistors of the same conductivity type, and are all assumed to be N-type TFTs in the present embodiment.

As shown in FIG. 3, the conventional unit shift register SR includes a first power terminal s1 to which a low supply voltage VSS is supplied, and second and third terminals s2 and s3 to which high supply voltages VDD1 and VDD2 are supplied, respectively, in addition to the input terminal IN, output terminal OUT, first clock terminal A and second clock terminal B shown in FIG. 2. The high supply voltages VDD1 and VDD2 may be at the same level. In the following description, the low supply voltage VSS will be a reference potential of the circuit; in practical use, however, a reference potential is determined with reference to a voltage of data written in pixels. For example, the high supply voltages VDD1 and VDD2 may be set at 17V, and the low supply voltage VSS may be set at −12V.

The output stage of the unit shift register SR includes a transistor Q1 (first transistor) connected between the output terminal OUT and first clock terminal A and a transistor Q2 (second transistor) connected between the output terminal OUT and first power terminal s1. Hereinafter, a gate node of the transistor Q1 constituting the output stage of the unit shift register SR will be defined as a node N1 (first node), and a gate node of the transistor Q2 will be defined as a node N2 (second node).

A step-up capacitor C is provided between the gate and source of the transistor Q1 (i.e., between the output terminal OUT and node N1). A transistor Q3 is connected between the node N1 and second power terminal s2, and has its gate connected to the input terminal IN. Transistors Q4 and Q5 are connected between the node N1 and first power terminal s1. The transistor Q4 has its gate connected to the second clock terminal B, and the transistor Q5 has its gate connected to the node N2. A diode-connected transistor Q6 is connected between the node N2 and third power terminal s3, and a transistor Q7 is connected between the node N2 and first power terminal s1, and has its gate connected to the node N1.

The transistor Q7 is defined as having a driving capability (current driving capability) sufficiently higher than that of the transistor Q6. In other words, the transistor Q7 has an on-state resistance lower than that of the transistor Q6. Accordingly, as the gate voltage of the transistor Q7 rises, the node N2 drops in potential; as the gate voltage of the transistor Q7 drops, the node N2 rises in potential. That is, the transistors Q6 and Q7 constitute a ratio inverter whose operation is defined by the ratio between their on-state resistances. This inverter constitutes a "pull-down driving circuit" which drives the transistor Q2 for pulling down the output terminal OUT.

A specific operation of the unit shift register SR shown in FIG. 3 will now be discussed. Since the respective unit shift registers SR constituting the gate-line driving circuit 30 operate substantially in the same manner, the operation of one unit shift register SR will be discussed as a representative example. For ease of description, it is assumed that the first clock terminal A of the unit shift register SR receives the clock signal CLK1 and the second clock terminal B receives the clock signal CLK3. This case corresponds to, e.g., the unit shift registers SR1 and SR4 shown in FIG. 2. An output signal output from the unit shift register SR at the output terminal OUT is defined as $G_n$, and an output signal from a unit shift register SR of the immediately preceding stage is defined as $G_{n-1}$.

In the initial state, it is assumed that the node N1 is at the L (low) level (VSS), and the node N2 is at the H level (VDD2-Vth (Vth: threshold voltage of transistor)). Hereinafter, this state will be called a "reset state". It is also assumed that the first clock terminal A (clock signal CLK1), second clock terminal B (clock signal CLK3) and input terminal IN (output signal $G_{n-1}$ from the immediately preceding stage) are all at the L level. In the reset state, the transistor Q1 is off (cut-off state) and the transistor Q2 is on (conducting state). Accordingly, the output terminal OUT (output signal $G_n$) is kept at the L level regardless of the level at the first clock terminal A (clock signal CLK1). That is, the gate line connected to this unit shift register SR is in the non-selected state.

Starting from that state, the output signal $G_{n-1}$ from the immediately preceding stage, when raised to the H level, is input to the input terminal IN of the unit shift register SR of concern to turn on the transistor Q3. At this time, the node N2 is at the H level, and thus, the transistor Q5 is also on, however, the node N1 rises in potential since the transistor Q3 is defined as having a driving capability sufficiently higher than that of the transistor Q5 and having an on-state resistance sufficiently lower than that of the transistor Q5.

The transistor Q7 thereby starts conducting, causing the node N2 to drop in potential. Then, the transistor Q5 increases in resistance, causing the node N1 to rapidly rise in potential to sufficiently turn on the transistor Q7. As a result, the node N2 drops to the L level (VSS), the transistor Q5 turns off, and the node N1 rises to the H level (VDD1-Vth). In such state where the node N1 is at the H level and the node N2 is at the L level (hereinafter this state will be called a "set state"), the transistor Q1 is on, and the transistor Q2 is off. Since the node N1 is brought into a floating state even when the output signal $G_{n-1}$ from the immediately preceding stage returns to the L level to turn off the transistor Q3, this set state is further maintained.

In the set state, the transistor Q1 is on and the transistor Q2 is off. Thus, when the clock signal CLK1 input to the first clock terminal A rises to the H level, the output terminal OUT rises in potential. At this time, the node N1 is stepped up by a certain voltage (hereinafter referred to as a "step-up amount ΔV") by a capacitive coupling between the step-up capacitor C and gate-channel capacitance (gate capacitance) of the transistor Q1. Accordingly, the gate-source voltage of the transistor Q1 is maintained higher than the threshold voltage (Vth) even when the output terminal OUT rises in potential, so that the transistor Q1 maintains a low impedance. Therefore, the output signal $G_n$ varies in level along with the potential at the first clock terminal A. Particularly when the gate-source voltage of the transistor Q1 is sufficiently high, the transistor Q1 operates in the non-saturated condition, causing no loss by the threshold voltage, which brings the output terminal OUT into the same potential as the clock signal CLK1. Accordingly, while the clock signal CLK1 input to the first clock terminal A is at the H level, the output signal $G_n$ is also at the H level to bring the gate line into a selected state. Thereafter, when the clock signal CLK1 returns to the L level, the output signal $G_n$ also returns to the L level to bring the gate line into a non-selected state.

Thereafter, when the clock signal CLK3 input to the second clock terminal B rises to the H level, the transistor Q4 is turned on to cause the node N1 to drop to the L level. The transistor Q7 accordingly turns off to cause the node N2 to rise to the H level. That is, the unit shift register SR returns to the reset state in which the transistor Q1 is off and the transistor Q2 is on.

Giving a summary of the above-described operation, the unit shift register SR is in the reset state unless a signal (start pulse) is input to the input terminal IN, and the node N2 is maintained at the H level (VDD2-Vth) during that period, so that the output terminal OUT (gate line) is maintained at the L level (VSS) with low impedance. When a signal is input to the input terminal IN, the node N2 drops to the L level (VSS) while the node N1 is charged to the H level (VDD1-Vth), so that the set state is brought about. In the set state, the node N1 rises in potential by the step-up amount ΔV when the signal input to the first clock terminal A (clock signal CLK1) rises to the H level. While the first clock terminal A is at the H level, the output terminal OUT rises to the H level to activate the gate line (therefore, the node N1 may also be called a "step-up node"). Thereafter, when a signal (clock signal CLK3) is input to the second clock terminal B, the node N1 returns to the L level (VSS) and the node N2 returns to the H level (VDD2-Vth), so that the original reset state is brought about (therefore, the node N2 may also be called a "reset node").

Figure 4:
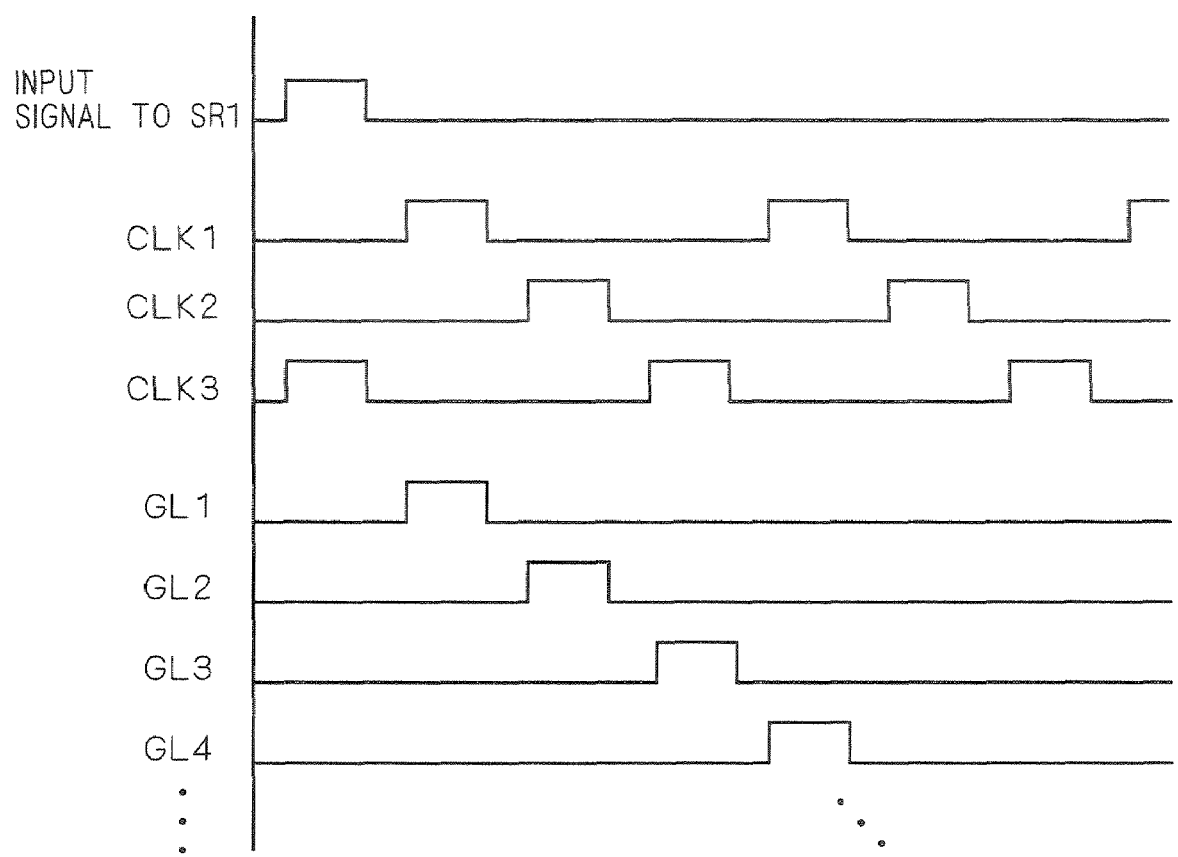
FIG. 4 is a timing chart of an operation of a gate-line driving circuit.

A plurality of unit shift registers SR each operating as described above are connected in cascade as shown in FIG. 2 to constitute the gate-line driving circuit 30. Then, the input signal (start pulse) input to the input terminal IN of the unit shift register SR of the first stage is transmitted to unit shift registers SR2, SR3, . . . in sequence while being shifted with timing synchronized with the clock signals CLK1, CLK2 and CLK3 as shown in the timing chart of FIG. 4. The gate-line driving circuit 30 can thereby drive the gate lines GL1, GL2, GL3, . . . in sequence in a predetermined scanning cycle.

Figure 5:
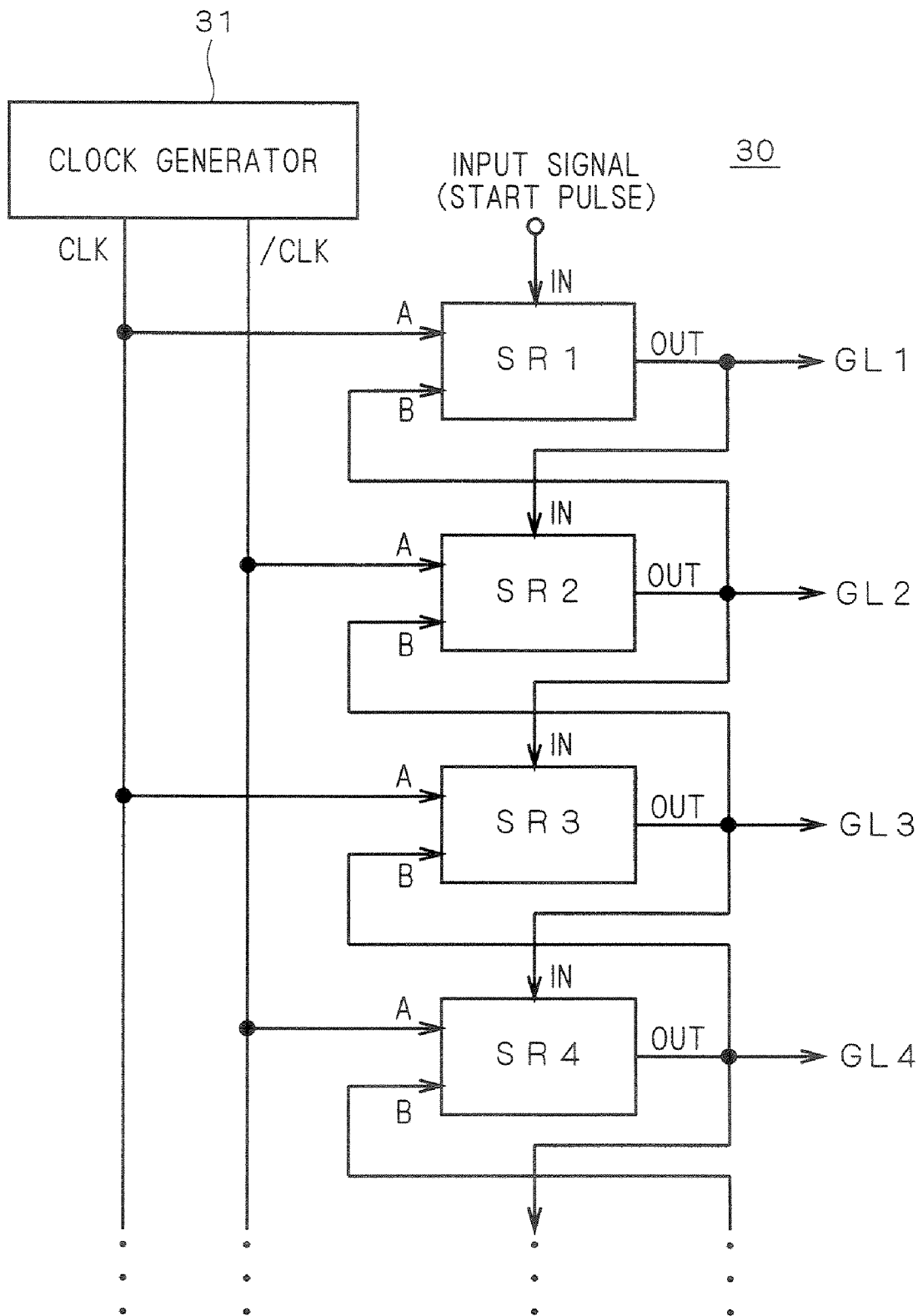
FIG. 5 is a block diagram illustrating another exemplary configuration of a gate-line driving circuit.

While the above example shows the case in which the plurality of unit shift registers SR operate on the basis of three phase clock signals, two phase clock signals may be used for operation. FIG. 5 illustrates the configuration of the gate-line driving circuit 30 in that case.

In that case, the gate-line driving circuit 30 also includes a plurality of unit shift registers SR connected in cascade. Specifically, each of the unit shift registers SR has its input terminal IN connected to the output terminal OUT of a unit shift register SR of the immediately preceding stage, except that the input terminal IN of the unit shift register SR of the first stage receives a start pulse as an input signal.

The clock generator 31 in this case outputs two phase clock signals CLK and /CLK of opposite phases to each other. Either of the clock signals CLK and /CLK is alternately input to the first clock terminal A of each of the unit shift registers SR such that each adjacent unit shift registers SR receive clock signals of opposite phases to each other, respectively. As shown in FIG. 5, each of the unit shift registers SR has the second clock terminal B connected to the output terminal OUT of a unit shift register SR of a succeeding stage (in this example, the immediately succeeding stage).

The operation of a unit shift register SR in the gate-line driving circuit 30 configured as shown in FIG. 5 will be described. The operation of one unit shift register SR will also be discussed as a representative example. For ease of description, it is assumed that the first clock terminal A of the unit shift register SR receives the clock signal CLK1. This case corresponds to, e.g., the unit shift registers SR1 and SR3 shown in FIG. 5. An output signal from the unit shift register SR of concern is defined as $G_n$, and output signals from unit shift registers SR of the immediately preceding and succeeding stages are defined as $G_{n-1}$ and $G_{n+1}$, respectively.

In the initial state, the reset state is assumed in which the node N1 is at the L level (VSS) and the node N2 is at the H level (VDD2-Vth). It is also assumed that the first clock terminal A (clock signal CLK), second clock terminal B (output signal $G_{n+1}$ from the immediately succeeding stage) and input terminal IN (output signal $G_{n-1}$ from the immediately preceding stage) are all at the L level.

Starting from that state, the output signal $G_{n-1}$ from the immediately preceding stage, when raised to the H level, is input to the input terminal IN of the unit shift register SR of concern to turn on the transistor Q3, causing the node N1 to rise in potential. The transistor Q7 thereby starts conducting, causing the node N2 to drop in potential. Then, the transistor Q5 increases in resistance, causing the node N1 to rapidly rise in potential, so that the transistor Q7 sufficiently turns on. As a result, the node N2 drops to the L level (VSS) to turn off the transistor Q5, causing the node N1 to rise to the H level (VDD1-Vth). As a result, the set state is brought about in which the transistor Q1 is on and the transistor Q2 is off.

Then, when the clock signal CLK rises to the H level to cause the output terminal OUT to rise in potential, the node N1 rises in potential by a certain voltage (step-up amount ΔV) by the capacitive coupling between the step-up capacitor C and gate-channel capacitance of the transistor Q1. Therefore, the output signal $G_n$ varies in level along with the level at the first clock terminal A. While the clock signal CLK is at the H level, the output signal $G_n$ is also at the H level. Thereafter, when the clock signal CLK returns to the L level, the output signal $G_n$ also returns to the L level.

After the output signal $G_n$ is transmitted to a unit shift register SR of the immediately succeeding stage, and when the output signal $G_{n+1}$ from the immediately succeeding stage rises to the H level, the signal $G_{n+1}$ is input to the second clock terminal B to turn on the transistor Q4, causing the node N1 to drop to the L level. The transistor Q7 accordingly turns off, causing the node N2 to rise to the H level. That is, the unit shift register SR of concern returns to the reset state in which the transistor Q1 is off and the transistor Q2 is on.

As described, in the case of the gate-line driving circuit 30 configured as shown in FIG. 5, the operation of each of the unit shift registers SR is substantially the same as in the case of FIG. 2 except that the second clock terminal B receives the output signal $G_{n+1}$ from the immediately succeeding stage.

The above-described operation is carried out in sequence by the plurality of unit shift registers SR1, SR2, ... connected in cascade as shown in FIG. 5. Accordingly, the input signal (start pulse) input to the input terminal IN of the unit shift register SR1 of the first stage is transmitted to the unit shift registers SR2, SR3, ... in sequence while being shifted with timing synchronized with the clock signals CLK and /CLK. As a result, the gate-line driving circuit 30 can thereby drive the gate lines GL1, GL2, GL3, ... in sequence in synchronization with the clock signals CLK and /CLK as shown in the timing chart of FIG. 6.

Figure 6:
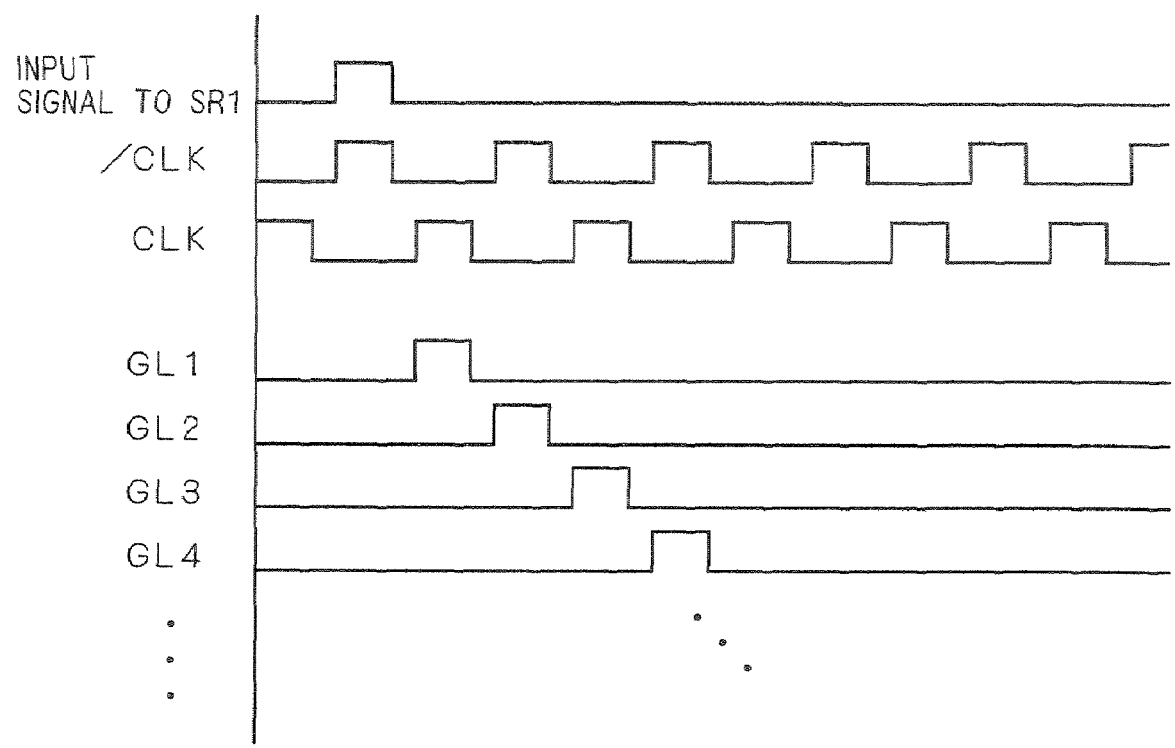
FIG. 6 is a timing chart of an operation of the gate-line driving circuit shown in FIG. 5.

In the configuration shown in FIG. 5, however, the second clock terminal B receives the output signal $G_{n+1}$ from the immediately succeeding stage. Accordingly, each of the unit shift registers SR returns to the reset state (i.e., the above-described initial state) only after a unit shift register SR of the immediately succeeding stage is operated at least once. Each of the unit shift registers SR cannot carry out the normal operation as shown in FIG. 6 unless it undergoes the reset state. Therefore, the configuration shown in FIG. 5 requires carrying out a dummy operation in which a dummy input signal is transmitted through the unit shift registers SR from the first to the last stages prior to the normal operation. Alternatively, a reset transistor may additionally be provided between the node N2 and third power terminal s3 (high supply voltage) of each of the unit shift registers SR to carry out a reset operation of compulsory charging the node N2 prior to the normal operation. In that case, however, the provision of a reset signal line is additionally required.

The aforementioned step-up amount ΔV will now be described. As described earlier, the step-up amount ΔV needs to be as large as possible in order that the shift register SR can charge the gate line at high speeds. In the circuit shown in FIG. 3, let the amplitude of the clock signal input to the first clock terminal A be Ac, the capacitance of the step-up capacitor C be C0, the gate capacitance of transistor Q1 be C1, and the parasitic capacitance at node N1 (excluding the gate capacitance of transistor Q1) be Cp, the step-up amount ΔV is obtained by the following equation:

$$\Delta V = Ac \times (C0+C1)/(C0+C1+Cp) \qquad (1)$$

In the case of the circuit shown in FIG. 3, the parasitic capacitance Cp corresponds to the sum of a gate capacitance C7 of the transistor Q7 and the capacitance (wiring capacitance) CL of a wire to be the node N1. As understood from the equation (1), the step-up amount ΔV can be made larger by decreasing the capacitance Cp in value.

As described earlier, each unit shift register SR constituting the gate-line driving circuit 30 needs to activate the gate line by charging at high speeds with the output signal $G_n$. Therefore, the transistor Q1 is required to have a high driving capability. The driving capability of the transistor Q1 can be made higher by increasing the step-up amount ΔV, which hence achieves high-speed charging of the gate line. A shift register according to the present invention capable of achieving such effect will be described below.

FIG. 7 is a circuit diagram illustrating the configuration of the unit shift register SR according to the first preferred embodiment of the present invention. As shown in the drawing, the output stage of the unit shift register SR includes the transistor Q1 (first transistor) connected between the output terminal OUT and first clock terminal A and the transistor Q2 (second transistor) connected between the output terminal OUT and first power terminal s1. The step-up capacitor C is provided between the gate and source of the transistor Q1, i.e., between the node N1 and output terminal OUT. The transistor Q3 is connected between the node N1 and second power terminal s2, and has its gate connected to the input terminal IN. Transistors Q4 and Q5 are connected between the node N1 and first power terminal s1. The transistor Q4 has its gate connected to the second clock terminal B, and the transistor Q5 has its gate connected to the node N2. The diode-connected transistor Q6 is connected between the node N2 and third power terminal s3, and the transistor Q7 is connected between the node N2 and first power terminal s1. This configuration is the same as the conventional unit shift register SR shown in FIG. 3.

In the present embodiment, however, the gate (control electrode) of the transistor Q7 and the node N1 are not connected directly, but are connected through a separation circuit formed by transistors Q8 and Q9. Specifically, the transistor Q7 according to the present embodiment is a transistor (third transistor) connected to the node N1 through the separation circuit. The gate node of the transistor Q7 is defined as a node N3 (third node).

The transistor Q8 is connected between the nodes N1 and N3 with its gate and drain (node N3) connected to each other. In other words, the transistor Q8 is diode-connected, and serves as a unidirectional switching device which conducts in a direction from the node N3 to node N1 (that is, the terminal on the node N3 side is anode and the terminal on the node N1 side is cathode). The transistor Q9 is connected between the node N3 and input terminal IN with its gate connected to the input terminal IN. Therefore, in the circuit shown in FIG. 7, when the input terminal IN rises to the H level, the transistor Q3 turns on to charge the node N1, and at the same time, the transistor Q9 also turns on to charge the node N3. In other words, the transistor Q9 serves as a charging device for charging the node N3 at the time of charging the node N1.

The operation of the unit shift register SR according to the present embodiment will now be described. In the following case, unit shift registers SR are assumed to be connected as shown in FIG. 5 to constitute the gate-line driving circuit 30. The operation of one unit shift register SR will be discussed as a representative example. It is assumed that the first clock terminal A of the unit shift register SR receives the clock signal CLK. An output signal from the unit shift register SR of concern is defined as $G_n$, and output signals from unit shift registers SR of the immediately preceding and succeeding stages are defined as $G_{n-1}$ and $G_{n+1}$, respectively.

As the initial state, the reset state is assumed in which the node N1 is at the L level (VSS) and the node N2 is at the H level (VDD2-Vth). It is also assumed that the first clock terminal A (clock signal CLK), second clock terminal B (output signal $G_{n+1}$ from the immediately succeeding stage) and input terminal IN (output signal $G_{n-1}$ from the immediately preceding stage) are all at the L level.

Starting from that state, when the output signal $G_{n-1}$ from the unit shift register SR of the immediately preceding stage rises to the H level, the transistors Q3 and Q9 turn on. At this time, the transistor Q5 also turns on since the node N2 is at the L level, however, the node N1 rises in potential since the transistor Q3 is defined as having a driving capability sufficiently higher than that of the transistor Q5 and having an on-state resistance sufficiently lower than that of the transistor Q5.

Since the transistor Q8 is diode-connected so that the circuit conducts from the node N3 to node N1, the node N3 is not supplied with charges from the node N1, but is supplied with charges from the transistor Q9 (that is, the transistor Q8 allows charging from the node N3 to node N1 but blocks charging from the node N1 to node N3). When the node N3 thereby rises in potential, the transistor Q7 starts conducting to cause the node N2 to drop in potential. Then, the transistor Q5 increases in resistance to cause the node N1 to rapidly rise in potential. The node N3 accordingly rises further to the H level to sufficiently turn on the transistor Q7.

As a result, the node N2 drops to the L level (VSS) to turn off the transistor Q5, causing the node N1 to rise to the H level (VDD1-Vth). That is, the set state is brought about in which the transistor Q1 is on and the transistor Q2 is off. Since the nodes N1 and N3 are in a floating state even when the output signal $G_{n-1}$ from the immediately preceding stage returns to the L level, this set state is further maintained.

Then, when the clock signal CLK input to the first clock terminal A rises to the H level, the output terminal OUT rises in potential. At this time, the node N1 is stepped up by the step-up amount ΔV by the capacitive coupling between the step-up capacitor C and gate-channel capacitance of the transistor Q1. When the node N1 is stepped up, the output signal $G_n$ varies in level along with the level at the first clock terminal A. While the clock signal CLK is at the H level, the output signal $G_n$ rises to the H level during to activate the gate line. Thereafter, when the clock signal CLK returns to the L level, the output signal $G_n$ also returns to the L level.

When the node N1 is stepped up above the node N3 (that is, when the node N1 is higher than the node N3 in absolute value of potential), the nodes N1 and N3 are electrically isolated from each other since the unit shift register SR according to the present embodiment does not conduct from the node N1 to node N3. As a result, the gate capacitance C7 of the transistor Q7 does not contribute to the parasitic capacitance Cp at the node N1 at the time of stepping up the node N1, which reduces the parasitic capacitance Cp. As understood from the equation (1), the smaller the parasitic capacitance Cp, the larger the step-up amount ΔV, resulting in higher driving capability of the transistor Q1 at the time of stepping up the node N1. The unit shift register SR can thereby charge the gate line at high speeds. This achieves higher speed operation of the gate-line driving circuit 30 constituted from such unit shift registers SR, which contributes to higher resolution of the liquid crystal display 10.

Thereafter, when the second clock terminal B rises to the H level upon receipt of the output signal $G_{n+1}$ from the immediately succeeding stage, the transistor Q4 turns on to cause the node N1 to drop to the L level. Since the circuit conducts from the node N3 to node N1, charges at the node N3 are discharged to the node N1 side through the transistor Q8 when the node N1 is lower than the node N3 in potential. Then, the node N3 drops in potential along with the potential at the node N1. The potential at the node N3 as dropped is the threshold voltage (Vth) of the transistor Q8, and the transistor Q7 operates in a weak inversion region; however, since only a small amount of current flows, the node N2 which is the output of the inverter (pull-down driving circuit) formed by the transistors Q6 and Q7 rises to the H level. That is, the reset state is brought about again in which the transistor Q1 is off and the transistor Q2 is on.

Thereafter, since no charges are supplied to the node N3 until the output signal $G_{n-1}$ from the immediately preceding stage rises to the H level, the node N3 drops from the threshold voltage Vth with time due to leakage current in the transistor Q8, further reducing the current flowing through the transistor Q7. Then, the inverter formed by the transistors Q6 and Q7 is stabilized and less likely to be inverted.

As described, the unit shift register SR according to the present embodiment is capable of carrying out an operation similar to that of the conventional circuit shown in FIG. 3. Further, as described earlier, the gate capacitance C7 of the transistor Q7 does not contribute to the parasitic capacitance Cp at the node N1 at the time of stepping up the node N1, which reduces the parasitic capacitance Cp. This results in higher driving capability of the transistor Q1 at the time of stepping up the node N1. The unit shift register SR can thereby charge the gate line at high speeds.

Also as described earlier, the wiring capacitance CL at the node N1 also contributes to the parasitic capacitance Cp at the node N1 which is a determinant factor of the step-up amount ΔV. Therefore, the step-up amount ΔV can be made larger by decreasing the wiring capacitance CL at the node N1. Since the wiring capacitance CL depends on the length of a wire to be the node N1, that wire may be shortened. Specifically, when laying out the respective components constituting the unit shift register SR, placing the transistor Q1 and step-up capacitance C as close to the transistor Q8 (i.e., isolation circuit) as possible can reduce the wiring capacitance CL at the node N1. In the unit shift register SR according to the present embodiment, the node N3 is electrically isolated from the node N1 at the time of stepping up the node N1, so that the wiring capacitance at the node N3 does not affect the step-up amount ΔV. Accordingly, an increase in length to some degree of a wire to be the node N3 does not decrease the step-up amount ΔV. Therefore, wiring may be carried out such that at least one (preferably both) of a wire length between the gate of the transistor Q1 and source of the transistor Q8 and a wire length between the step-up capacitor C and source of the transistor Q8 is shorter than a wire length between the gate of the transistor Q7 and drain of the transistor Q8.

In the conventional unit shift register SR (FIG. 3), the transistor Q1 and step-up capacitor C are required to be placed as close to the transistor Q7 as possible in order to reduce the wiring capacitance CL at the node N1. The transistor Q7, however, constitutes the ratio inverter together with the transistor Q6, and is required to have a driving capability sufficiently higher than that of the transistor Q6. Thus, the size (gate width) of the transistor Q7 should be greater than a certain value. Accordingly, many limits are imposed on the layout of the transistor Q7, which makes it difficult to lay out the transistor Q7 close to the transistor Q1 and step-up capacitor C.

In contrast, the unit shift register SR according to the present embodiment may be configured such that the transistor Q1 and step-up capacitor C are placed as close to the transistor Q8 (isolation circuit) as possible in order to reduce the wiring capacitance CL at the node N1. Since the transistor Q8 only needs to operate as a diode for discharging electric charges at the node N3, its driving capability may be relatively small and its size may also be small. Thus, there is a high flexibility in laying out the transistor Q8. Therefore, the present invention also achieves advantageous effects of easy placement of the transistor Q8 as close to the transistor Q1 and step-up capacitor C as possible and easy reduction of the wiring capacitance CL at the node N1.

While the above description illustrates the operation in the case of configuring the unit shift register SR according to the present invention as shown in FIG. 5, the present invention may also be applicable to the case as shown in FIG. 2.

Second Preferred Embodiment

FIG. 8 is a circuit diagram illustrating the configuration of a unit shift register SR according to a second preferred embodiment of the present invention. According to the present embodiment, the transistor Q3 has its drain connected to the input terminal IN, not to the power source. This can reduce the area occupied by a wire for power supply. However, it should be noted that the input terminal IN is connected to the output terminal OUT of the immediately preceding stage, which increases a load on the output stage of each unit shift register SR, so that the speed of circuit operation may be degraded.

Third Preferred Embodiment

A field effect transistor including TFT is a device which conducts by electric connection between the drain and source made by a conductive channel formed directly under a gate electrode with a gate insulation film interposed therebetween when a voltage not less than a threshold voltage is applied to the gate. Accordingly, a field effect transistor in the conducting state may also function as a capacitive element (gate capacitance) with its gate and channel serving as both electrodes and the gate insulation film serving as a dielectric layer.

Figure 9:
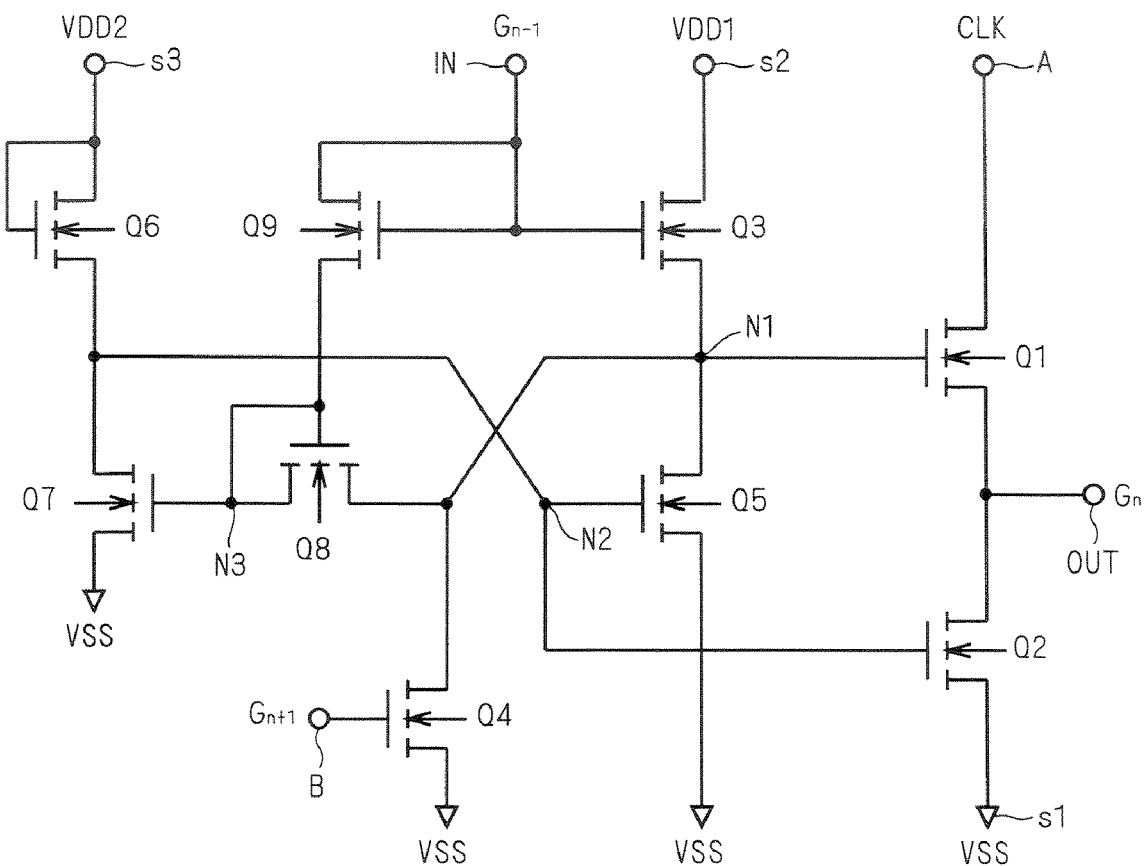
FIG. 9 is a circuit diagram illustrating the configuration of a unit shift register according to a third preferred embodiment of the present invention.

FIG. 9 is a circuit diagram illustrating the configuration of a unit shift register SR according to a third preferred embodiment of the present invention. While the step-up capacitor C is provided between the drain and source of the transistor Q1 in the first preferred embodiment, it is replaced by the gate capacitance of the transistor Q1 in the present embodiment. In this case, the step-up capacitor C is not required, as shown in the circuit diagram of FIG. 9.

The insulation film to be a dielectric layer of a capacitive element formed in a semiconductor integrated circuit generally has the same thickness as a gate insulation film of a transistor. Accordingly, when replacing a capacitive element by a gate capacitance of a transistor, a transistor having the same area as the capacitive element may be used. Specifically, increasing the gate width of the transistor Q1 as necessary in FIG. 9 achieves a step-up operation equivalent to that performed by the circuit shown in FIG. 7 according to the first preferred embodiment. Further, increasing the gate width of the transistor Q1 increases its driving capability, resulting in increased rising and falling rates of the output signal, which produces another advantageous effect of achieving higher speed operation.

Fourth Preferred Embodiment

Figure 10:
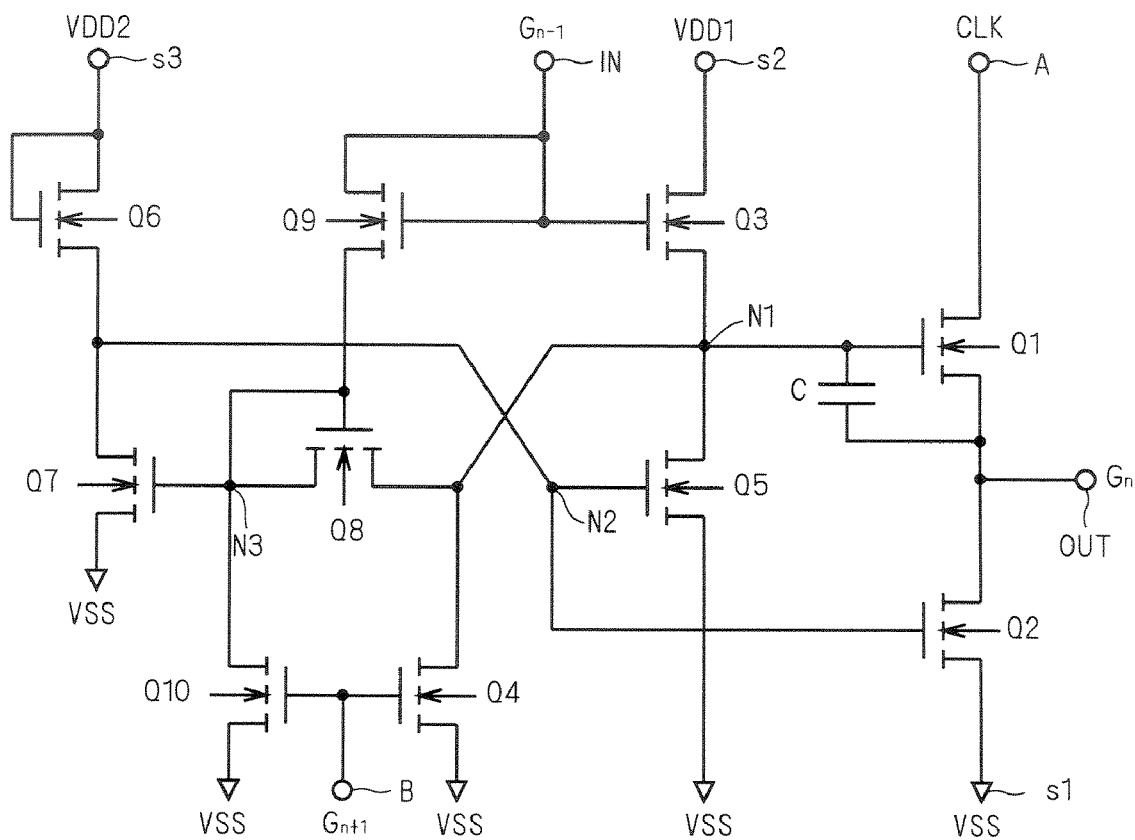
FIG. 10 is a circuit diagram illustrating the configuration of a unit shift register according to a fourth preferred embodiment of the present invention.

FIG. 10 is a circuit diagram illustrating the configuration of a unit shift register SR according to a fourth preferred embodiment of the present invention. The unit shift register SR includes a transistor Q10 connected between the node N3 and first power terminal s1 (low supply voltage VSS) in the circuit shown in FIG. 7 according to the first preferred embodiment. The transistor Q10 has its gate connected to the second clock terminal B.

As described earlier, in the circuit shown in FIG. 7, the node N1 drops in potential when the second clock terminal B rises to the H level. Just after the node N3 drops in potential following this, the node N3 drops to the level of the threshold voltage (Vth) of the transistor Q8, not to the low supply voltage VSS. Even in that case, there is generally no problem in operation since a small amount of current flows through the transistor Q7. However, when the transistors vary in threshold voltages, for example, when the transistor Q8 has a high threshold voltage or the transistor Q7 has a low threshold voltage, the transistor Q7 may be turned off insufficiently to cause a malfunction of the unit shift register SR.

In contrast, in the unit shift register SR shown in FIG. 10 according to the present embodiment, the transistor Q10 turns on when the second clock terminal B rises to the H level, causing the node N3 to drop to the low supply voltage VSS. That is, this ensures the input to the inverter (pull-down driving circuit) formed by the transistors Q6 and Q7 to be the L level. Therefore, even when the transistors vary in threshold voltages, the transistor Q7 can be turned off sufficiently. This can prevent the unit shift register SR from malfunctioning due to variations in threshold voltages of the transistors, which achieves improved operational reliability.

While illustration is omitted, the transistor Q3 may have its drain connected to the input terminal IN in the present embodiment, similarly to the second preferred embodiment. Further, the transistor Q1 may be increased in area similarly to the third preferred embodiment to replace the step-up capacitor C by the gate capacitance of the transistor Q1.

Fifth Preferred Embodiment

FIG. 11 is a circuit diagram illustrating the configuration of another conventional unit shift register disclosed in, e.g., the aforementioned JP2004-103226, FIG. 14. This unit shift register SR is configured such that the ratio inverter (pull-down driving circuit) formed by the transistors Q6 and Q7 has its output applied not directly to the node N2, but through a buffer formed by transistors Q11 and Q12.

In this case, the parasitic capacitance Cp at the node N1 corresponds to the sum of the gate capacitance C7 of the transistor Q7, the gate capacitance C12 of the transistor Q12, and capacitance (wiring capacitance) CL of a wire to be the node N1. That is, the circuit shown in FIG. 11 has a higher parasitic capacitance Cp at the node N1 by the gate capacitance C12 of the transistor Q12 and a smaller step-up amount $\Delta V$ obtained by the equation (1), than the circuit shown in FIG. 3.

According to the present embodiment, the present invention is applied to a unit shift register SR of the type in which the output of a pull-down driving circuit is applied to the node N2 through a buffer as shown in FIG. 11. The circuit diagram of such unit shift register SR is shown in FIG. 12. The transistor Q12 constituting the buffer has its gate connected to the node N3. That is, the unit shift register SR according to the present embodiment has two transistors (third transistors), i.e., the transistors Q7 and Q12 connected to the node N1 through an isolation circuit.

As described earlier, the node N3 is electrically isolated from the node N1 at the time of stepping up the node N1 in the unit shift register SR according to the present invention. Thus, neither of the gate capacitances of the transistors Q7 and Q12 connected to the node N3 contributes to the parasitic capacitance Cp at the node N1. In other words, the parasitic capacitance Cp at the node N1 in the circuit shown in FIG. 12 is at a similar level to that in the first preferred embodiment (FIG. 7). Accordingly, the step-up amount $\Delta V$ increases, and the transistor Q1 increases in driving capability at the time of stepping up the node N1. The unit shift register SR can thereby charge the gate line at high speeds.

Figure 13:
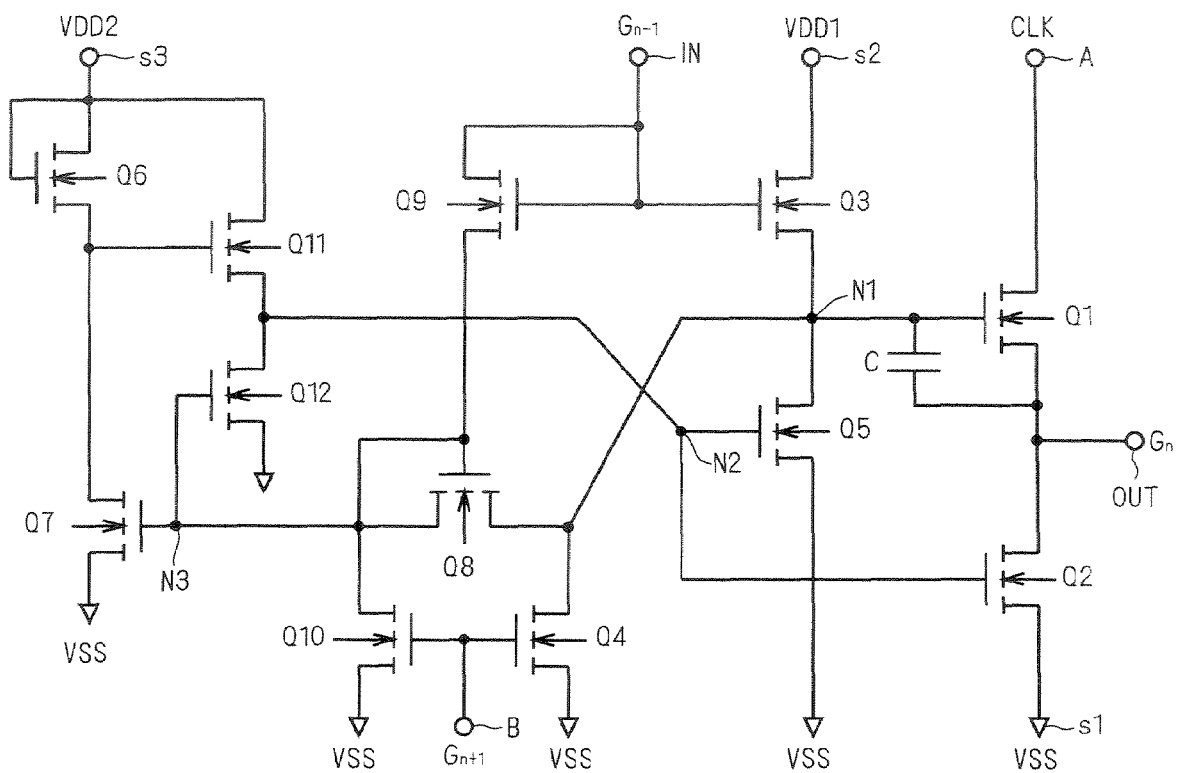

Further, the fifth preferred embodiment may be applied to the circuit shown in FIG. 12 to provide the transistor Q10 with its gate connected to the second clock terminal B, between the node N3 and first power terminal s1 (low supply voltage VSS) as shown in FIG. 13. Accordingly, similarly to the fifth preferred embodiment, the transistor Q7 can be turned off sufficiently on the basis of the signal input to the second clock terminal B. This can prevent the unit shift register SR from malfunctioning due to variations in threshold voltages of the transistors, which achieves improved operational reliability.

While illustration is omitted, the transistor Q3 may have its drain connected to the input terminal IN in the present embodiment, similarly to the second preferred embodiment. Further, the transistor Q1 may be increased in area similarly to the third preferred embodiment to replace the step-up capacitor C by the gate capacitance of the transistor Q1.

While the invention has been shown and described in detail, the foregoing description is in all aspects illustrative and not restrictive. It is therefore understood that numerous modifications and variations can be devised without departing from the scope of the invention.

What is claimed is:

1. A shift register, comprising:
    a first transistor configured to supply a clock signal input at a clock terminal to an output terminal, said first transistor having a control electrode connected to a first node;
    a second transistor configured to discharge said output terminal, said second transistor having a control electrode connected to a second node;
    at least one third transistor having a control electrode connected to a third node which connects to said first node through a predetermined isolation circuit; and
    a fourth transistor configured to charge said first node in response to an input signal supplied into an input terminal, wherein
    said isolation circuit includes a charging element configured to charge said third node in response to said input signal and electrically isolates said third and first nodes from each other when said first node is higher than said third node in absolute value of potential.

2. The shift register according to claim 1, wherein said at least one third transistor includes a transistor connected between said second node and a power terminal.

3. The shift register according to claim 1, wherein said isolation circuit includes:
    a unidirectional switching element configured to allow charging from said third node to said first node and to block charging from said first node to said third node.

4. The shift register according to claim 1, wherein a wire length between the control electrode of said first transistor and said isolation circuit is shorter than a wire length between said isolation circuit and the control electrode of said third transistor.

5. The shift register according to claim 1, further comprising
    a capacitive element connected between said first node and said output terminal.

6. The shift register according to claim 5, wherein a wire length between said capacitive element and said isolation circuit is shorter than a wire length between said isolation circuit and the control electrode of said third transistor.

7. A shift register comprising a plurality of shift registers connected in cascade, each being defined in claim 1.

8. An image display apparatus, comprising:
    a gate-line driving circuit formed by a plurality of shift registers connected in cascade, wherein
    each of said plurality of shift registers includes
    a first transistor configured to supply a clock signal input at a clock terminal to an output terminal, said first transistor having a control electrode connected to a first node;
    a second transistor configured to discharge said output terminal, said second transistor having a control electrode connected to a second node;
    at least one third transistor having a control electrode connected to a third node which connects to said first node through a predetermined isolation circuit; and
    a fourth transistor configured to charge said first node in response to an input signal supplied into an input terminal, wherein
    said isolation circuit includes a charging element configured to charge said third node in response to said input signal and electrically isolates said third and first nodes from each other when said first node is higher than said third node in absolute value of potential.

* * * * *